United States Patent [19]
Gorsuch et al.

[11] Patent Number: 5,888,662
[45] Date of Patent: Mar. 30, 1999

[54] MODIFIED ELECTRODES FOR DISPLAY DEVICES

[75] Inventors: Cynthia A. Gorsuch; Franky So, both of Tempe; Song Shi, Phoenix, all of Ariz.

[73] Assignee: Motorola, Inc., Schaumburg, Ill.

[21] Appl. No.: 757,003

[22] Filed: Nov. 26, 1996

[51] Int. Cl.$^6$ ............... B32B 9/00; H05B 33/14; A01J 63/04
[52] U.S. Cl. ............ 428/690; 313/503; 313/504; 313/506; 428/331; 428/469; 428/470; 428/471; 428/917
[58] Field of Search ................. 313/503, 504, 313/506; 428/331, 469, 470, 471, 690, 917

[56] References Cited

U.S. PATENT DOCUMENTS 4,356,429 10/1982 Tang ........................ 313/503
4,950,950 8/1990 Perry et al. ................ 313/504

OTHER PUBLICATIONS

Article entitled Organic Electroluminescent Devices by Sheats, et al. *Science*, vol. 273, 16 Aug., 1996, pp. 884–888.

*Primary Examiner*—John M. Cooney, Jr.
*Attorney, Agent, or Firm*—Eugene A. Parsons

[57] ABSTRACT

An organic electroluminescent display device (10) includes a plurality of organic layers (16, 18, and 20) disposed between opposing electrode assemblies (12 and 14). One electrode assembly, for example the anode assembly (12), may be fabricated of a substrate (22) and an electrode (24), wherein the electrode is modified by the addition of a modifier species. The modifier species compensates for mismatches between the electrode layer and the overlaying organic material layers which are respectively hydrophilic and hydrophobic. The modifier is preferably a silane or disilane material.

4 Claims, 2 Drawing Sheets

5,888,662

MODIFIED ELECTRODES FOR DISPLAY DEVICES

TECHNICAL FIELD

This invention relates in general to flat panel information display devices and in particular to light emitting organic electroluminescent information display devices.

BACKGROUND OF THE INVENTION

Until fairly recently, the preferred, indeed the only means by which to display information in the electronic medium was to use a video monitor comprising a cathode ray tube ("CRT"). CRT technology has been well known for over 50 years, and has gained widespread commercial acceptance in applications ranging from desktop computer modules to home televisions and industrial applications. CRTs are essentially large vacuum tubes having one substantially planar surface upon which information is displayed. Coated on the inside of the CRT planar surface is a layer of phosphors which respond by emitting light when struck by electrons emitted from the electron gun of the CRT. The electron gun is disposed in an elongated portion which extends away from the inside of the CRT display surface.

While CRTs are widely used in numerous applications, there are several inherent limitations to the application of CRT technology. For example, CRTs are relatively large and consume a great deal of energy. Moreover, as they are fabricated of glass, the larger the display surface, the heavier the CRT. Given the need for the electron gun to be spacedly disposed from the phosphor surface of the display, CRTs have a substantial depth dimension. Accordingly, CRTs have little practical applicability in small and portable applications, such as handheld televisions, laptop computers, and other portable electronic devices which require the use of displays.

To answer the needs of the marketplace for smaller, lighter, more portable display devices, manufacturers have created numerous types of flat panel display devices. Examples of flat panel display devices include active matrix liquid crystal displays (AMLCD's), plasma displays, and electroluminescent displays. Each of these types of displays has use for a particular market application, though each are accompanied by various limitations which make them less than ideal for certain applications. Principal limitations inherent in devices such as AMLCD's relate to the fact that they are fabricated predominantly of inorganic semiconductor materials by semiconductor fabrication processes. These materials and processes are extremely expensive, and, due to the complexity of the manufacturing process, cannot be reliably manufactured in high yields. Accordingly, the costs of these devices are very high with no promise of immediate cost reduction.

One preferred type of device which is currently receiving substantial research effort is the organic electroluminescent device. Organic electroluminescent devices ("OED") are generally composed of three layers of organic molecules sandwiched between transparent, conductive and/or metallic conductive electrodes. The three layers include an electron transporting layer, an emissive layer, and a hole transporting layer. As used herein, the charge carriers which combine in the emissive layer are electrons and holes. The electrons are negatively charged atomic particles and holes are positively charged counterparts. OED's are attractive owing to low driving voltage, i.e., less than about 20 volts. Hence, they have a potential application to full color flat emissive displays.

One problem which has plagued OED's has been the stability of the devices, and in particularly the thermal stability of the hole transporting material. Degradation in these materials have been observed and are typically attributable to one of two problems: (1) phase stability of hole transporting materials, namely the tendency to recrystallize or aggregate, which is a function of the glass transition temperature of the hole transporting material; and (2) the adhesion of hole transporting materials which are typically organic, to the materials from which the electrodes are fabricated, which are typically inorganic. These problems may be due to thermal expansion coefficient mismatch and surface tension mismatch (hydrophobicity or hydrophilicity) between the organic hole transporting material and the inorganic electrode materials.

To address issues arising from this mismatch between the organic and inorganic layers, numerous solutions have been proposed. For example, in U.S. Pat. No. 4,356,429, it was proposed to insert a thin layer of organometallic material between the organic and inorganic materials. The organometallic materials have physical properties which are between those of the organic and inorganic materials and thus serve as a buffer layer. Examples of such organometallic materials include metal phthalocyanine complexes such as copper phthalocyanine, and zinc phthalocyanine. Another solution was proposed in an article authored by J. Sheats, et al in *Science Magazine* (Science 273, 884, (1996)) which describes spincoating a thin layer of polyaniline between the organic and inorganic materials. The article reports that the lifetime of the OED was drastically increased. One final approach which may be employed is described in commonly assigned, copending patent application Ser. No. 08/743,257, entitled "Organic Electroluminescent Light Emitting Material and Device Using Same", filed 4 Nov. 1996 which is now U.S. Pat. No. 5,747,183 in the names of Song Shi, et al, the disclosure of which is incorporated herein by reference. In that patent application, the inventors describe a structure in which a layer of a conductive polymer passivating material is disposed between the electrode structure and the organic materials of the organic electroluminescent display device.

While each of these approaches provides a solution to the problem, there are numerous shortcomings attendant to each. For example, organometallic materials described in the '429 patent are both relatively expensive and difficult to deposit with high reliability. Similarly, spincoat deposition of polyaniline between the hole transporting and ITO materials is a relatively difficult process which may both increase the cost and decrease the manufacturing yield of OED's.

Accordingly, there exists a need for improved electrode structures for use in OED's. The electrode structures should enhance the thermal coefficient matching and the surface tension matching between the organic hole transporting layer materials and the inorganic electrode materials. The solution to the problem should be fabricated of a relatively inexpensive material which can be deposited via readily available, highly-rel reliable, inexpensive processes.

DETAILED DESCRIPTION OF THE PREFERRED EMBODIMENT

Figure 1:
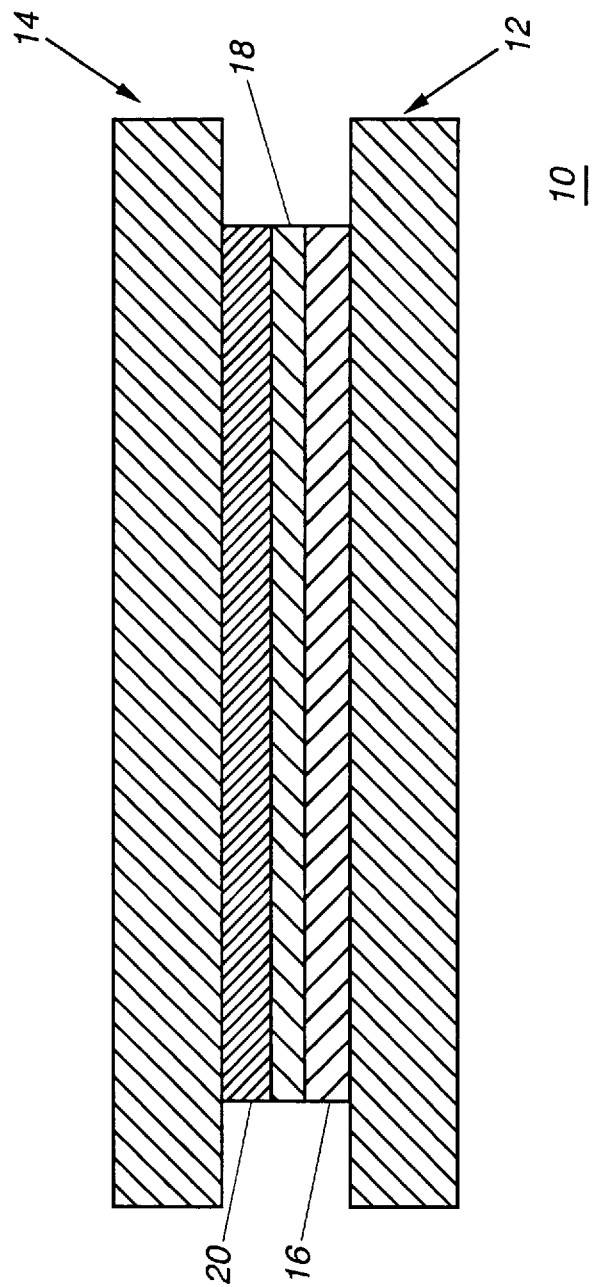
FIG. 1 is a cross-sectional side view of an organic electroluminescent device in accordance with the instant invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, there is illustrated therein an organic electroluminescent device 10 as is well known in the art. The device contains, as a rule, one or more layers of organic charge transport materials. Device 10 is fabricated of two electrode assemblies 12 and 14, electrode assembly 12 being the anode electrode assembly, and electrode assembly 14 being the cathode assembly. The anode and cathode assemblies, and particularly the anode assembly 12 will be described in greater detail hereinbelow.

Operatively disposed between the anode and cathode assemblies are a plurality of layers of organic electroluminescent materials. A first layer 16 deposited atop the anode assembly 12 is a layer of a hole transporting material. The purpose of the hole transporting material is to facilitate transfer of holes from the anode assembly 12 to the emitter layer 18. In the emitter layer, holes are combined with electrons provided via the electron transporting layer from the cathode assembly 14 to create photons for the emission of light. The hole transporting material layer 16 may be fabricating of any of a number of materials which are known in the art, though in one preferred embodiment the hole transporting material may actually be a multicomponent compound consisting of a hole transporting material and a polymeric network selected to stabilize the hole transporting material, particularly at elevated temperatures. Examples of this type of a hole transporting material are disclosed in, for example, commonly assigned, copending U.S. patent application Ser. No. 08/706,898 entitled "Polymer Stabilized Molecular Hole Transporting Materials For Organic Electroluminescent Displays" filed on Aug. 30, 1996 in the names of Song Shi, et al, the disclosure of which is incorporated herein by reference.

Deposited atop the hole transporting layer 16 is a layer of emitter material 18. The emitter layer 18 is typically comprised of a host emitting matrix and a guest emitter. The host emitting matrix is fabricated of an organic material adapted to accommodate both holes and electrons and then transfer the excited state energies to the guest emitter where the holes and electrons combine and emit a photon of light causing a visible change in the appearance of the OED device to a viewer thereof. The materials that can be used as the host emitting matrix include metal chelated oxinoid compounds disclosed in, for example, U.S. Pat. Nos. 4,769,292 and 5,529,853, as well as in commonly assigned, copending U.S. patent application Ser. No. 08/304,451 filed Sep. 12, 1994, the disclosures of which are incorporated herein by reference. Examples of preferred host emitting matrix materials are selected from tris(8-quinolinol) aluminum, bis(10-oxo-benzoquinine beryllium), bis(2-(2-oxy-phenyl)benzoxazole) zinc, 2-(2-oxy-phenyl benzothiazole) zinc and combinations thereof. The materials which can be used as a guest emitter include dyes and pigments of high fluorescent efficiencies. For efficient energy transfer it is necessary that the guest emitter material has a band gap no greater than that of the material making up the emitting host matrix. It is preferred that the guest emitter material is present in a concentration of from $10^{-3}$ to 10 mole % based on the moles of materials comprised of the emitting host matrix. The selection of the guest emitting materials is well known to those of ordinary skill in the art.

Thereafter deposited atop the emitter layer 18 is an electron transporting layer 20 fabricated of a material selected from the group of materials disclosed in U.S. Pat. Nos. 4,769,292 and 5,529,853 as well as in commonly assigned, copending U.S. patent application Ser. No. 08/304, 451 filed Sep. 12, 1994, the disclosures of which are incorporated herein by reference. The electron transporting layer is adapted to gather charge carriers, in this case, electrons, from the cathode assembly 14 for transport to the emitter layer where they are combined with holes in a manner described hereinabove. In this regard, appropriate electron transport materials include tris(8-quinolinol) aluminum, bis(10-oxo-benzoquinoline beryllium), bis(2-(2-oxy-phenyl)benzoxazole)zinc, 2-(2oxy-phenyl benzothiazole) zinc and combinations thereof.

In operation, holes inject from the anode assembly and electrons inject from the cathode assembly into the organic layers disposed between the two assemblies, when an electrical current is applied between the anode and the cathode. An electrical current may be applied by connecting the electrodes to electrical current generation means (not shown) at electrical contacts on each of the anode and cathode assembly.

Figure 2:
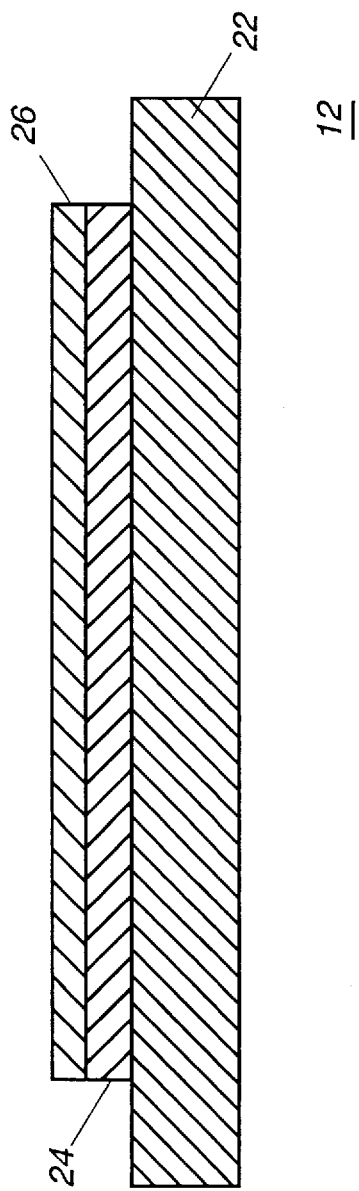
FIG. 2 is a cross-sectional side view of an electrode structure for an organic electroluminescent device in accordance with the instant invention.

Referring now to FIG. 2, there is illustrated therein an electrode assembly in accordance with the instant invention. The electrode assembly may be either electrode 12 or 14 of FIG. 1. For purposes of FIG. 2, the electrode assembly is the anode assembly 12 of FIG. 1. The anode assembly 12 of FIG. 1 is fabricated upon a first substrate 22 which is transparent and may be fabricated of any of a number of known materials employed in the art. For example, substrate 12 may be fabricated of a glass such as Corning 7059 glass, transparent plastic substrates made of polyolefins, polyethyl sulfones, polyacrylates, and combinations thereof. In one preferred embodiment, the substrate is fabricated of a high quality glass such as that commonly used for the fabrication of flat panel display devices.

Disposed atop substrate 22 is an electrode layer 24 which is electrically conductive and optically transparent or semitransparent. Several materials may be advantageously employed as the first electrode 24 and the anode structure for the electronic display device. Such materials are preferably conductive oxide materials, and most preferably transparent conductive oxide materials. Examples of such transparent conductive oxide materials include indium tin oxide (ITO), indium oxide, tin oxide, zinc oxide, zinc tin oxide, vanadium oxide, and combinations thereof. In one preferred embodiment, the electrode of electrode structure 12 is fabricated of a thin layer of ITO deposited to a thickness of between 50 Å and 5000 Å. The electrode layer 24 may be further patterned so as to define a plurality of discrete picture elements.

The conductive oxide materials in the fabrication of the electrode layer 24 include therein a substantial percentage of hydroxy molecules which are present at the surface of said electrode layer. As a result, conductive oxides such as indium tin oxides are very hydrophilic. Conversely, the materials commonly used as the hole injecting layer and the hole transporting layers 16 of FIG. 1 are very hydrophobic. This incompatibility between layers results in decreases in the operating lifetime of the organic electroluminescent device as well as increasing the operating voltages in numerous cases. These problems are well documented in the prior art.

To eliminate this incompatibility, the layer of transparent conductive oxide material includes operative amounts of a modifier species adapted to chemically bond to the hydroxy molecules in the conductive oxide material. As illustrated in FIG. 2, a layer of the modifier species 26 is illustrated as having been bonded to the surface of layer 24 opposite substrate 22. It is to be understood, however, that the modifier may not necessarily form a continuous layer atop the conductive oxide material used as the electrode. Rather, it may be a discontinuous layer and further may include bonded modifier species dispersed throughout the bulk of the conductive oxide itself.

In accordance with the present invention, the modifier is preferably a silane or disilane, and is selected from a group of materials characterized by general formulas I or II below:

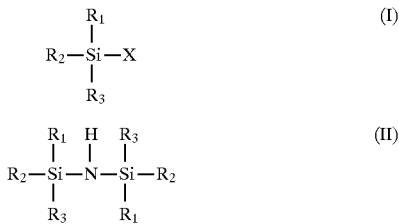

Wherein in each formula:

X represents a halide such as F, Cl, Br, I;

$R_1$, $R_2$, and $R_3$ each represent one or more of hydrogen or functional groups selected from the group of materials consisting of halogens, cyano groups, alkyl groups, alkoxyl groups, aryl groups, amino groups, aminoalkyl groups, aminoaryl groups, and combinations thereof, and further including at least one tertiary amine of the following structure:

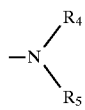

wherein $R_4$ and $R_5$ being either an alkyl or aryl group.

Examples of modifiers that satisfy the present invention include chloro(N,N-dimethylamino)dimethylsilane, chloro(N,N-dimethylamniomethyl)dimethylsilane, 1,3-bis(N,N-dimethylaminomethyl)-1,1,3,3-tetramethyldisilazane, dichloro(N,N'-diethylamino)methylsilane, chloro(N,N-diphenylamniomethyl)dimethylsilane.

The application of silane to conductive oxide surface can be carried out either in vapor phase or in solution, both of which are well known to those skilled in the art. When exposed to the modifier, the hydroxy groups on the ITO surface undergo the following reaction:

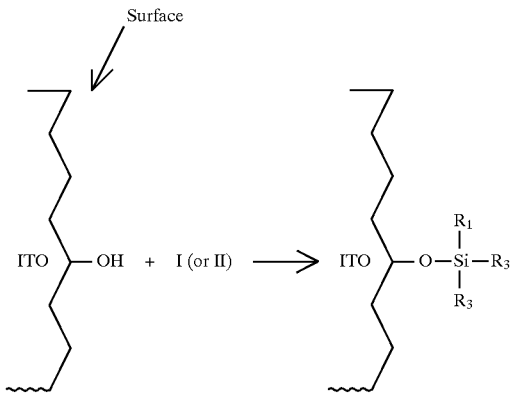

As a result of reaction with the modifier, the ITO surface becomes more hydrophobic. While this alone has a beneficial effect on the stability and life of an OED into which it is incorporated, including a tertiary amine group on the silane make the modified surface much more compatible with the next layer of organic hole transporting material, which is usually made of an organic aromatic tertiary amine. Thus the incompatibility problem between inorganic electrode layer and the layer of organic hole transporting material has been substantially solved.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An organic electroluminescent display device comprising a first electrode, a second electrode, and at least one layer of organic electroluminescent material disposed between said first and second electrodes, wherein at least one of said first and second electrodes is deposited on a transparent substrate, and comprises a conductive oxide material and a modifier species chemically bonded to hydroxy molecules in said conductive oxide material, wherein said modifier is selected from a group of materials characterized by the following general formulas:

or

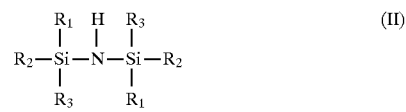

wherein in each formula:

X represents a halide such as F, Cl, Br, I;

$R_1$, $R_2$, and $R_3$ each represent one or more of hydrogen or functional groups selected from the group of materials consisting of halogens, cyano groups, alkyl groups, alkoxyl groups, aryl groups, amino groups, aminoalkyl groups, aminoaryl groups, and combinations thereof, and further including at least one tertiary amine of the following structure:

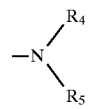

wherein $R_4$ and $R_5$ are either an alkyl or aryl group.

2. An organic electroluminescent device as in claim 1, wherein said conductive oxide is a transparent conductive oxide.

3. An organic electroluminescent device as in claim 2, wherein said transparent conductive oxide material is selected from the group of materials consisting of indium tin oxide, tin oxide, indium oxide, zinc oxide, vanadium oxide, and combinations thereof.

4. An organic electroluminescent device as in claim 1, wherein said modifier species is selected from the group of materials consisting of chloro(N,N-dimethylamino)dimethylsilane, chloro(N,N-dimethylamniomethyl)dimethylsilane, 1,3-bis(N,N-dimethylaminomethyl)-1,1,3,3-tetramethyldisilazane, dichloro(N,N'-diethylamino)methylsilane, chloro(N,N-diphenylamniomethyl)dimethylsilane, and combinations thereof.

* * * * *